(12) United States Patent
Senzaki et al.

(10) Patent No.: US 6,537,613 B1
(45) Date of Patent: Mar. 25, 2003

(54) PROCESS FOR METAL METALLOID OXIDES AND NITRIDES WITH COMPOSITIONAL GRADIENTS

(75) Inventors: Yoshihide Senzaki, Carlsbad, CA (US); Arthur Kenneth Hochberg, Solana Beach, CA (US); John Anthony Thomas Norman, Encinitas, CA (US)

(73) Assignee: Air Products and Chemicals, Inc., Allentown, PA (US)

( * ) Notice: Subject to any disclaimer, the term of this patent is extended or adjusted under 35 U.S.C. 154(b) by 0 days.

(21) Appl. No.: 09/546,867

(22) Filed: Apr. 10, 2000

(51) Int. Cl.$^7$ ................................................ C23C 16/06
(52) U.S. Cl. .................. 427/250; 427/240; 427/455
(58) Field of Search ................................ 427/250, 455, 427/240

(56) References Cited

U.S. PATENT DOCUMENTS

| | | | |
|---|---|---|---|
| 3,441,453 A | 4/1969 | Conrad et al. | |
| 3,893,876 A | 7/1975 | Akai et al. | |
| 5,158,653 A | * 10/1992 | Lashmore et al. | 427/255.7 |
| 5,834,070 A | * 11/1998 | Movchan et al. | 427/126.1 |
| 5,882,410 A | 3/1999 | Kawahara et al. | |
| 5,923,056 A | 7/1999 | Lee et al. | |
| 5,923,524 A | 7/1999 | Cava | |
| 5,945,167 A | * 8/1999 | Kuwabara et al. | 427/376.3 |
| 6,296,771 B1 | * 10/2001 | Miroslav | 210/656 |
| 6,403,745 B1 | * 6/2002 | Scherer et al. | 526/319 |

* cited by examiner

*Primary Examiner*—Bret Chen
(74) *Attorney, Agent, or Firm*—Geoffrey L. Chase

(57) ABSTRACT

A process for deposition of a multiple metal and metalloid compound layer with a compositional gradient of the metal and metalloid in the layer on a substrate of an electronic material, comprising: a) providing two or more metal-ligand and metalloid-ligand complex precursors, wherein the ligands are preferably the same; b) delivering the precursors to a deposition zone where the substrate is located; c) contacting the substrate under deposition conditions with the precursors; d) varying the temperature of deposition from a first temperature to a second distinct temperature which is at least 40° C. from said first temperature during the contact, and e) depositing a multiple metal and metalloid compound layer on the substrate from the precursors resulting in the compositional gradient of the metal and metalloid in the layer as a result of step d). An oxygen source can be added to result in a metal-metalloid oxide, or a nitrogen source can be added to result in a metal-metalloid nitride, or a mixture of an oxygen and a nitrogen source can be added to result in a metal-metalloid oxynitride. The metalloid would preferably be silicon.

28 Claims, 1 Drawing Sheet

PROCESS FOR METAL METALLOID OXIDES AND NITRIDES WITH COMPOSITIONAL GRADIENTS

BACKGROUND OF THE INVENTION

Multicomponent metal containing materials, such as mixed-metal/metalloid oxides and nitrides often have unique physical properties that each individual metal/metalloid oxide/nitride component does not possess. For example, some mixed metal oxides can be used for high dielectric constant materials, R. Cava et al., Nature, vol. 377, p.215, (1995), ferroelectrics, L. M. Sheppard, Ceramic Bulletin, vol.71, p.85, (1992), high temperature superconductors, D. L. Schulz et al. Adv. Mater., vol.6, p.719, (1994), catalysts, M. Gugliemi et al., J. Electrochem. Soc., vol.139, p.1655, (1992), and corrosion resistent coating, N. Hara et al., J. Electrochem. Soc., vol.146, p.510, (1999). Also some mixed metal nitrides show good diffusion barrier properties, X. Sun et al., J. Appl. Phys. Vol.81, p.664, (1997), superconducting, R. B. Van Dover, Chem. Mater., vol. 5, p.32, (1993), and magnetic properties, K. Schunitzke et al., Appl. Phys. Lett., vol. 57, p. 2853, (1990).

As the size of integrated circuits (IC) devices becomes aggressively smaller, thin films deposited by chemical vapor deposition (CVD) demonstrates an advantage over physical vapor deposition (PVD) methods in terms of conformal coverage on various non-planer surfaces. In general, liquid precursors are preferred for CVD applications due to the ease and reproducibility in precursor delivery.

Common precursor delivery methods used in CVD processing include vapor draw, bubbling with carrier gas, mist droplet (aerosol) delivery, and direct liquid injection (DLI). DLI is particularly a preferred method for the consistent delivery of multi-components because it delivers the same ratio of constituents to the reactor as are in the source container. DLI has the added advantage of storing the precursor at room temperature and heating only the amount required to be delivered, and therefore, improving precursor shelf life.

Metal silicates for electronic materials have been studied by those skilled in the art. For instance, Wilk, et. al., Hafnium and Zirconium silicates for advanced gate dielectrics, Journal of Applied Physics, Vol. 87, No. 1, 2000, pp. 484–492 describe the use of metal silicates as gate dielectric films with varying metal contents. Depositions were by sputtering and e-beam evaporation. Separate films were deposited at specific temperatures chosen over the range of 25° C. to 600° C. Kolawa, et. al., Amorphous Ta—Si—N thin-film alloys as diffusion barrier in Al/Si metallizations, J. Vac. Sci. Technol. A 8 (3), May/June 1990, pp. 3006–3010, indicates that Ta—Si—N films of a wide range of compositions were prepared by rf reactive sputtering. The films were used as diffusion barriers. Nitrogen incorporation was varied by varying the amount of nitrogen in the reaction atmosphere. Sun, et. al., Reactively sputtered Ti—Si—N films. II. Diffusion barriers for Al and Cu metallizations on Si, J. Appl. Phys. 81 (2) Jan. 15, 1997, pp. 664–671, describes sputtered films of Ti—Si—N for interfacing with Al and Cu. Nitrogen content was varied during the depositions. Wilk, et. al., Electrical properties of hafnium silicate gate dielectrics deposited directly on silicon, Applied Physics Letters, Vol. 74, No. 19, 10 May 1999, pp. 2854–2856, describes $HfSi_xO_y$ gate dielectric films. Films were deposited at 500° C.

Other mixed metal systems of general interest are; VanDover, et. al., Discovery of a useful thin-film dielectric using a composition-spread approach, Nature, Vol. 392, 12 March 1998, pp. 162–164, discloses capacitance devices with high dielectric films of Zr—Sn—Ti—O. Depositions were performed below 300° C.; VanDover, et. al., Deposition of Uniform Zr—Sn—Ti—O Films by On-Axis Reactive Sputtering, IEEE Electron Device Letters, Vol. 19, No. 9, September 1998, pp. 329–331, describes sputtering at 200° C.±10° C.; Cava, et. al., enhancement of the dielectric constant of $Ta_2O_5$ through Substitution with $TiO_2$, Nature, Vol. 377, Sept. 21, 1995, pp. 215–217, prepared ceramic samples of $Ta_2O_5$—$TiO_2$ by physically mixing and firing at temperatures of 1350–1400° C.; Cava, et. al., Dielectric properties of $Ta_2O_5$—$ZrO_2$ polycrystalline ceramics, J. Appl. Phys. 83, (3), Feb. 1, 1998, pp. 1613–1616, synthesized ceramics by physical mixture and firing; U.S. Pat. Nos. 5,923,056 and 5,923,524 address mixed metal oxides for electronic materials.

In the field of electronic materials for device fabrication, such as interlayer dielectrics, gate oxides, capacitors and barrier layers, it is desirable to have materials which have a varying compositional gradient of mixed metals or metal/metalloid composition in either oxide, oxynitride or nitride form. The prior art has failed to provide a quick, simple and reproducible method for controllably producing a deposited layer of mixed metal/metalloid oxides, oxynitride or nitrides having a compositional gradient over the depth of the deposited layer.

The present invention overcomes this deficiency as will be set forth in greater detail below.

BRIEF SUMMARY OF THE INVENTION

A process for deposition of a multiple metal and metalloid compound layer with a compositional gradient of the metal and metalloid in the layer on a substrate of an electronic material, comprising: a) providing two or more metal-ligand and metalloid-ligand complex precursors, which preferably constitute a liquid at ambient conditions, wherein the ligands are preferably the same and are preferably selected from the group consisting of alkyls, alkoxides, halides, hydrides, amides, imides, azides, nitrates, cyclopentadienyls, carbonyls, pyrazoles, and their fluorine, oxygen and nitrogen substituted analogs; b) delivering the mixture to a deposition zone where the substrate is located; c) contacting the substrate under deposition conditions with the precursors, where the contacting the substrate under deposition conditions is preferably selected from the group consisting of chemical vapor deposition, spray pyrolysis, jet vapor deposition, sol-gel processing, spin coating, chemical solution deposition, and atomic layer deposition; d) varying the temperature of the deposition conditions from a first temperature to a second distinct temperature which is at least 40° C. from said first temperature during the contact, and e) depositing a multiple metal and metalloid compound layer on the substrate from the precursors resulting in the compositional gradient of the metal and metalloid in the layer as a result of step d). An oxygen source can be added to result in a metal-metalloid oxide, or a nitrogen source can be added to result in a metal-metalloid nitride, and a mixture of oxygen source and nitrogen source can be added to result in a metal-metalloid oxynitride. The metalloid would preferably be silicon.

BRIEF DESCRIPTION OF THE DRAWING

The drawing is a graph of atomic percent concentration and dielectric constant charted against temperature of a preferred embodiment of the present invention.

DETAILED DESCRIPTION OF THE INVENTION

Figure 1:
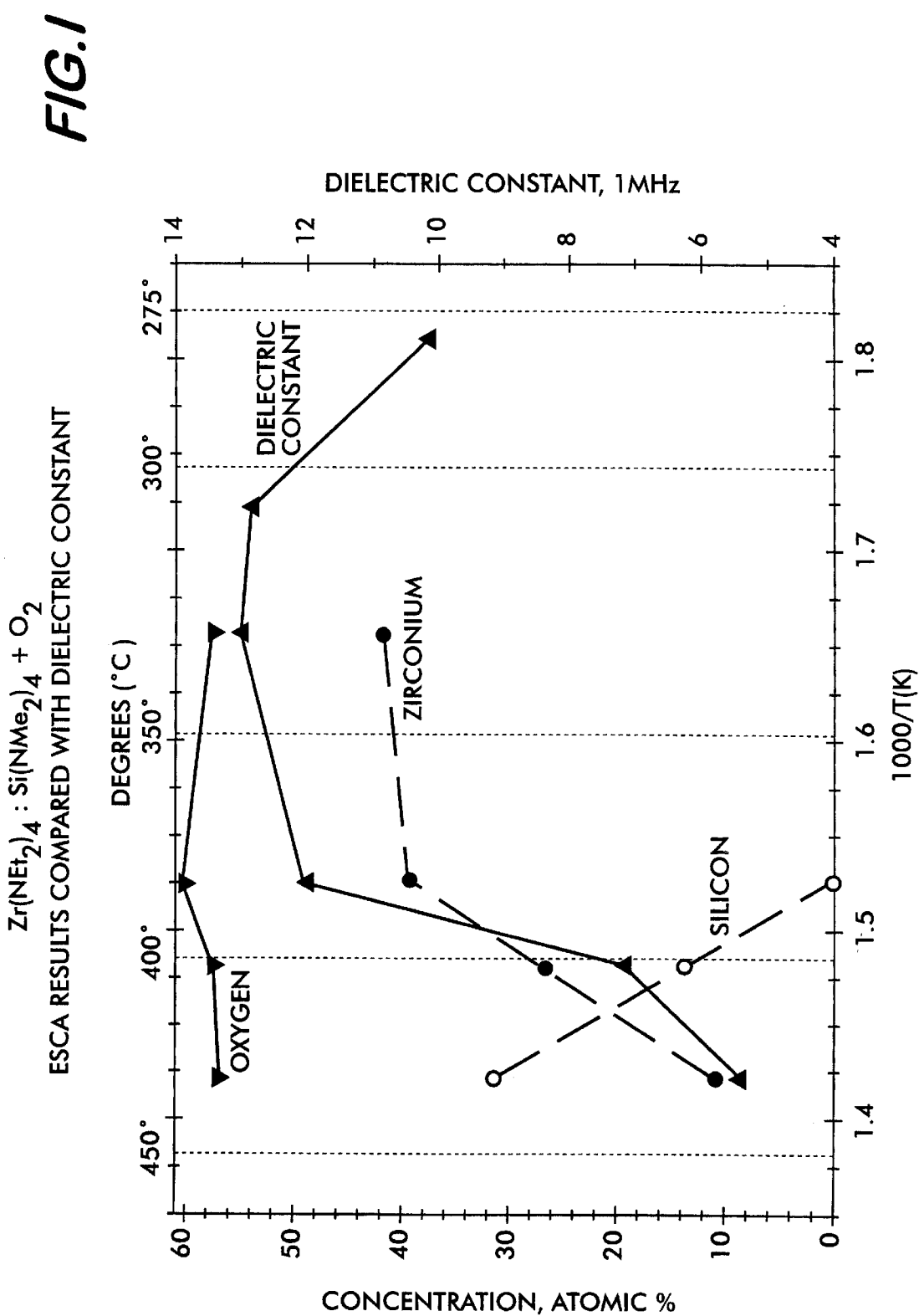

In the present invention a new metal and metalloid deposition resulting in a compositional gradient is disclosed that can be used for precursor dispersing delivery methods, including DLI in CVD applications. Preferably, the precursors are a solventless mixture.

The volatile components are chosen such that:
1) They are chemically compatible, therefore, no non-volatile polymeric or multinuclear species are formed.
2) No precipitates are generated due to ligand exchange on the metals or inter ligand reactions.
3) The mixtures maintain low viscosity and thermal stability.
4) Undesired redox chemistry will not take place (eg. $M^{+1}+M^{+3} \rightarrow M^{+2}+M^{+2}$).

In the preferred form, liquid mixtures can be prepared either by directly mixing liquid metal/metalloid complexes or dissolving solid metal or metalloid complex(es) in liquid metal or metalloid complex(es). In these systems, no solvent is needed to dissolve or dilute the precursor mixtures to achieve a total liquid phase of the resulting mixtures. The preferred non-solvent containing precursor mixtures lower the burden of abatement of the CVD effluent in the exhaust, because there is no extra volatile organic medium to be collected after the CVD processing. Besides, since no solvent is used in the preferred liquid mixtures described herein, high throughput of metal containing vapor can be delivered into the CVD reactor. Thus, the overall CVD process using these preferred liquid precursor mixtures is more environmentally benign and cost effective than liquid injection delivery of precursor solutions. The multi-component precursors used in the present invention are preferably water-like low viscosity materials at room temperature and have sufficient volatility at a relatively low temperature and can be easily delivered into a CVD system. It is also possible to practice the present invention using traditional mixtures of precursors in an appropriate solvent.

Surprisingly, in the present invention, as exemplified by the case of $Zr_x$—$Si_y$—$O_z$ CVD from a mixture of $Zr(NEt_2)_4$ and $Si(NMe_2)_4$, an unexpected dependency of the film composition on deposition temperature was observed. The results show that metal silicate thin films with metal/metalloid compositional gradient are deposited by controllably varying the deposition temperatures. The gate dielectric films with compositional gradients, such as, a silicon rich layer toward the silicon substrate vs a metal rich layer toward the gate metal may show unique compatibility and performance advantage in IC device fabrication. Metal silicate thin films whose refractivity gradients controlled by the silicon/metal compositional gradients may also be useful for electro-optics applications.

In the preferred mode, the mixture of two or more metal-ligand and metalloid-ligand complex precursors, which preferably constitute a liquid at ambient conditions, have ligands which can be the same or different and are selected from the group consisting of alkyls, alkoxides, halides, hydrides, amides, imides, azides, nitrates, cyclopentadienyls, carbonyls, βdiketonates βketoiminates, βdiiminates, pyrazoles and their fluorine, oxygen and nitrogen substituted analogs.

Appropriate choice of precursors, in the presence of oxidant or nitrogen containing reactant, would provide either mixed metal/metalloid oxides, nitrides, and oxynitrides. In addition, using proper precursor mixtures and CVD conditions, it is also possible to grow mixed metal/metalloid alloys, carbides, carbonitrides, oxycarbonitrides, sulfides, phosphides, borides, arsenides, antimonides, serenides, tellurides, and mixtures thereof.

In addition to thermal low pressure CVD, the above precursors could be used for atmospheric pressure CVD, sub-atmospheric pressure CVD, plasma, photo, radical, or laser enhanced CVD deposition, and jet vapor deposition well recognized deposition techniques, or by atomic layer deposition. In atomic layer deposition, an approximately single layer of precursor molecules are adsorbed on a surface. A second reactant is dosed onto the first precursor layer followed by a reaction between the second reactant and the first reactant already on the surface. This alternating procedure is repeated to provide the desired thickness of element or compound in a near atomic thickness layer.

Furthermore, appropriate choice of mixture precursors may also be applied to sol-gel processing and spin coating of films.

The ambient conditions are preferably less than or equal to 200° C., more preferably less than or equal to 40° C., and less than or equal to 30 psig.

The first temperature is in the range of 200–350° C. and the second distinct temperature is at least 40° C. above said first temperature, preferably 300–450° C. or above, to obtain the compositional gradient of the resulting film desired. It is preferable to vary the temperature during deposition in a constant manner from the low starting temperature to the high ending temperature. However, it is appreciated that the temperature can be manipulated to achieve any compositional gradient desired for a given metal/metalloid system and the desired compositional gradient.

The mixture is mixed with a source of oxygen prior to depositing the multiple metal/metalloid compound layer on the substrate to form the metal and metalloid oxide. The source of oxygen can be selected from the group consisting of oxygen, ozone, nitrous oxide, nitric oxide, nitrogen dioxide, water, hydrogen peroxide, air and mixtures thereof. Alternatively, the mixture is mixed with a source of nitrogen prior to depositing the multiple metal/metalloid compound layer on the substrate to form the metal and metalloid nitride. The source of nitrogen can be selected from the group consisting of nitrogen, ammonia, hydrazine, alkylhydrazine, hydrogen azide, alkylamine and mixtures thereof. Sources of nitrogen and oxygen or ligands with those elements can be used to produce mixed metal and metalloid oxynitrides.

The multiple metal and metalloid compound layer is selected from the group consisting of mixed metal and metalloid alloys, mixed metal and metalloid oxides, mixed metal metalloid nitrides, mixed metal and metalloid carbides, mixed metal and metalloid carbonitrides, mixed metal and metalloid oxycarbonitrides, mixed metal and metalloid oxycarbides, mixed metal and metalloid oxynitrides, mixed metal and metalloid sulfides, mixed metal and metalloid phosphides, mixed metal and metalloid borides, mixed metal and metalloid arsenides, mixed metal and metalloid antimonides, mixed metal and metalloid selenides, mixed metal and metalloid tellurides and mixtures thereof.

The metalloid is selected from the group consisting of boron, silicon, arsenic, tellurium, and mixtures thereof. Preferably, the metalloid is silicon.

The metal is selected from any metal of the Periodic Table of the Elements, preferably transition metals, more preferably they are individually selected from the group consisting of zinc, cadmium, mercury, aluminum, germanium, gallium, indium, thallium, tin, lead, antimony, bismuth, lithium, sodium, potassium, rubidium, cesium, beryllium, magnesium, calcium, strontium, barium, scandium, yttrium, lanthanum, titanium, zirconium, hafnium, vanadium, niobium, tantalum, chromium, molybdenum, tungsten, manganese, technetium rhenium, iron, ruthenium, osmium, cobalt, rhodium, iridium, nickel, palladium, platinum, copper, silver, gold, cerium and mixtures thereof.

The present invention will now be illustrated in several nonlimiting examples.

EXAMPLE 1

CVD of Zr—Si—O thin films from $Zr(NEt_2)_4$ and $Si(NMe_2)_4$

A solventless mixture of $Zr[N(CH_2CH_3)_2]_4$ and $Si[N(CH_3)_2]_4$, molar ratio Zr:Si=1:1) metal-ligand complex precursors was delivered at 0.12 ml per minute to a direct liquid injection system with a vaporization temperature of 110° C. using a helium sweep gas of 100 sccm with a variable oxygen flow, onto a wafer substrate target for mixed metal compound film deposition where the wafer was held between 280 and 430° C. The reactor chamber pressure was 1 Torr. Up to 380° C., the deposition rate increased from 450 to 560 angstroms per minute on bare silicon with oxygen flows of 150 sccm as the deposition temperature increases. At the deposition temperatures 400° C. and 430° C., the deposition rates dropped to 360 angstroms per minute then to 150 angstroms per minute, respectively. The attached drawing shows the X-ray photoelectron spectroscopy analysis of film compositions vs deposition temperatures. At deposition temperatures below 380° C., zirconium was predominantly incorporated in the film while the ratio of silicon incorporation increased at higher deposition temperatures. Also shown in the drawing are the dielectric constants of the as-deposited films determined by capacitance-voltage measurement which demonstrated that the dielectric constants of the films ranged from 5 to 13 depending on the metal composition. The refractive indexes of the films deposited at 280–380° C. were 1.96–2.02.The films deposited at 400–430° C. had lower refractive indices of 1.70–1.62. Refractive indexes decreased as the silicon content increases with higher deposition temperatures.

EXAMPLE 2

CVD of Zr—Si—N thin films from $Zr(NEt_2)_4$ and $Si(NMe_2)_4$

A solventless mixture of $Zr[N(CH_2CH_3)_2]_4$ and $Si[N(CH_3)_2]_4$, (molar ratio Zr:Si=1:1) metal-ligand complex precursors was delivered at 0.12 ml per minute to a direct liquid injection system with a vaporization temperature of 90° C. using a helium sweep gas of 100 sccm with an ammonia flow of 200 sccm, onto a wafer substrate target for mixed metal compound film deposition where the wafer was held between 300 and 360° C. The deposition rate ranged from 285 to 320 angstroms per minute on bare silicon. The reactor chamber pressure was 1 Torr.

EXAMPLE 3

CVD of Ta—Si—O thin films from t-BuN=Ta$(NEt_2)_3$ and $Si(NMe_2)_4$

A solventless mixture of t-BuN=Ta$[N(CH_2CH_3)_2]_3$ and $Si[N(CH_3)_2]_4$, (molar ratio Ta:Si=2.5:1) metal-ligand complex precursors was delivered at 0.1 ml per minute to a direct liquid injection system with a vaporization temperature of 100° C. using a helium sweep gas of 200 sccm with variable flows of 50 to 150 sccm oxygen, onto a wafer substrate target for mixed metal compound film deposition where the wafer was held between 300 and 435° C. The reactor chamber pressure was 1 Torr. The activation energy of the deposition was 29 kcal/mol.

EXAMPLE 4

CVD of Ta—Si—N thin films from t-BuN=Ta$(NEt_2)_3$ and $Si(NMe_2)_4$

A solventless mixture of t-BuN=Ta$[N(CH_2CH_3)_2]_3$ and $Si[N(CH_3)_2]_4$, (molar ratio Ta:Si=2.5:1) metal-ligand complex precursors was delivered at 0.1 ml per minute to a direct liquid injection system with a vaporization temperature of 100° C. using a helium sweep gas of 200 sccm with an ammonia flow of 73 sccm, onto a wafer substrate target for mixed metal compound film deposition where the wafer was held between 310 and 350° C. The reactor chamber pressure was 1 Torr. The activation energy of the deposition was 34 kcal/mol.

The prior art has failed to provide a method for depositing mixed metal/metalloid oxides and nitrides as electronic layers or devices in semiconductor materials where the metal/metalloid compositional gradient is varied by the temperature of the deposition process. The present invention overcomes this deficiency in the prior art with a simple, efficient reproducible process for varying metal/metalloid oxide, oxynitride or nitride materials compositional gradients over the deposition process by the controlled deposition temperature to provide unique deposition products with varying electrical properties useful in the electronic materials fabrication industry.

The present invention has been set forth with regard to several specific embodiments, but the full scope of the present invention should be ascertained from the claims which follow.

What is claimed is:

1. In a process for forming an electronic material comprising a compositional gradient of a metal and metalloid compound on a substrate, the improvement which comprises:
   a) providing a mixture of two or more metal-ligand and metalloid-ligand complex precursors;
   b) delivering said mixture of metal-ligand and metalloid-ligand complex precursors to a deposition zone where said substrate is located;
   c) contacting said substrate under deposition conditions with said mixture of metal-ligand and metalloid-ligand complex precursors;
   d) depositing a multiple metal and metalloid compound on said substrate from said mixture of metal-ligand and metalloid-ligand complex precursors during said contacting under deposition conditions; and,
   d) varying the temperature of said deposition conditions from a first temperature to a second distinct temperature which is at least 40° C. from said first temperature during said contacting under deposition conditions, whereby a multiple metal and metalloid compound layer is deposited on said substrate from said mixture of metal-ligand and metalloid-ligand complex precursors thereby resulting in said compositional gradient of the metal and metalloid compound on said substrate.

2. The process of claim 1 for deposition of a multiple metal and metalloid compound layer with a compositional gradient of the metal and metalloid in the layer on a substrate of an electronic material, comprising:

a) providing a mixture of two or more metal-ligand and metalloid-ligand complex precursors and are selected from the group consisting of alkyls, alkoxides, halides, hydrides, amides, imides, azides, nitrates, cyclopentadienyls, carbonyls, pyrazoles and their fluorine, oxygen and nitrogen substituted analogs;

b) delivering said mixture to a deposition zone where said substrate is located;

c) contacting said substrate under deposition conditions with said mixture, where said contacting said substrate under deposition conditions is selected from the group consisting of chemical vapor deposition, spray pyrolysis, jet vapor deposition, sol-gel processing, spin coating, chemical solution deposition, and atomic layer deposition;

d) varying the temperature of said deposition conditions from a first temperature to a second distinct temperature which is at least 40° C. from said first temperature during said contact, and e) depositing a multiple metal and metalloid compound layer on said substrate from said mixture resulting in said compositional gradient of the metal and metalloid in said layer as a result of step d).

3. The process of claim 2 wherein said metal is a transition metal.

4. The process of claim 2 wherein said metal is selected from the group consisting of zinc, cadmium, mercury, aluminum, germanium, gallium, indium, thallium, tin, lead, antimony, bismuth, lithium, sodium, potassium, rubidium, cesium, beryllium, magnesium, calcium, strontium, barium, scandium, yttrium, lanthanum, titanium, zirconium, hafnium, vanadium, niobium, tantalum, chromium, molybdenum, tungsten, manganese, technetium rhenium, iron, ruthenium, osmium, cobalt, rhodium, iridium, nickel, palladium, platinum, copper, silver, gold, cerium and mixtures thereof.

5. The process of claim 2 wherein said first temperature is in the range of 200–350° C. and said second distinct temperature is at least 40° C. above said first temperature.

6. The process of claim 2 wherein said mixture is mixed with a source of oxygen prior to depositing said multiple metal compound layer on said substrate.

7. The process of claim 6 wherein said source of oxygen is selected from the group consisting of oxygen, ozone, nitrous oxide, nitric oxide, nitrogen dioxide, water, hydrogen peroxide, air and mixtures thereof.

8. The process of claim 2 wherein said mixture is solventless and is mixed with a source of nitrogen prior to depositing said multiple metal compound layer on said substrate.

9. The process of claim 8 wherein said source of nitrogen is selected from the group consisting of nitrogen, ammonia, hydrazine, alkylhydrazine, hydrogen azide, alkylamine and mixtures thereof.

10. The process of claim 2 wherein said multiple metal and metalloid compound layer is selected from the group consisting of mixed metal and metalloid alloys, mixed metal and metalloid oxides, mixed metal and metalloid nitrides, mixed metal and metalloid carbides, mixed metal and metalloid carbonitrides, mixed metal and metalloid oxycarbonitrides, mixed metal and metalloid oxycarbides, mixed metal and metalloid oxynitrides, mixed metal and metalloid borides mixed metal and metalloid sulfides, mixed metal and metalloid phosphides, mixed metal and metalloid arsenides, mixed metal and metalloid antimonides, mixed metal and metalloid selenides, mixed metal and metalloid tellurides and mixtures thereof.

11. The process of claim 2 wherein said metalloid is selected from the group consisting of boron, silicon, arsenic, tellurium, and mixtures thereof.

12. The process of claim 2 wherein said metalloid is silicon.

13. The process claim 1 for deposition of a multiple metal and metalloid compound layer with a compositional gradient on a substrate of an electronic material, comprising:

a) providing a solventless mixture of two or more metal-ligand and metalloid-ligand complex precursors which constitute a liquid at ambient conditions, wherein said ligands are selected from the group consisting of alkyls, alkoxides, halides, hydrides, amides, imides, azides, nitrates, cyclopentadienyls, carbonyls, pyrazoles, and their fluorine, oxygen and nitrogen substituted analogs;

b) delivering said solventless mixture by direct liquid injection to a flash vaporization zone to vaporize said solventless mixture;

c) contacting said substrate under deposition conditions with a resulting vapor of said solventless mixture, and d) varying the temperature from a first temperature to a second distinct temperature which is at least 40° C. from said first temperature during said contact, and e) depositing a multiple metal and metalloid compound layer on said substrate from said solventless mixture resulting in said compositional gradient of the metal and metalloid in said layer as a result of step d).

14. The process of claim 13 wherein said ambient conditions are less than or equal to 200° C. and less than or equal to 30 psig.

15. The process of claim 13 wherein said first temperature is in the range of 200–350° C. and said second distinct temperature is at least 40° C. above said first temperature.

16. The process of claim 13 wherein said solventless mixture is mixed with a source of oxygen prior to depositing said multiple metal compound layer on said substrate.

17. The process of claim 16 wherein said source of oxygen is selected from the group consisting of oxygen, ozone, nitrous oxide, nitric oxide, nitrogen dioxide, water, hydrogen peroxide, air and mixtures thereof.

18. The process of claim 16 wherein said metal-ligand complex precursor is $Zr[N(CH_2CH_3)_2]_4$, said metalloid-ligand complex precursor is $Si[N(CH_3)_2]_4$, said first temperature is 280° C. and said second distinct temperature is 430° C.

19. The process of claim 16 wherein said metal-ligand complex precursor is t-butylN=$Ta[N(CH_2CH_3)_2]_3$, said metalloid-ligand complex precursor is $Si[N(CH_3)_2]_4$, said first temperature is 300° C. and said second distinct temperature is 435° C.

20. The process of claim 13 wherein said solventless mixture is mixed with a source of nitrogen prior to depositing said multiple metal compound layer on said substrate.

21. The process of claim 20 wherein said source of nitrogen is selected from the group consisting of nitrogen, ammonia, hydrazine, alkylhydrazine, hydrogen azide, alkylamine and mixtures thereof.

22. The process of claim 20 wherein said metal-ligand complex precursor is $Zr[N(CH_2CH_3)_2]_4$, said metalloid-ligand complex precursor is $Si[N(CH_3)_2]_4$, said first temperature is 300° C. and said second distinct temperature is 360° C.

23. The process of claim 20 wherein said metal-ligand complex precursor is t-butylN=$Ta[N(CH_2CH_3)_2]_3$, said metalloid-ligand complex precursor is $Si[N(CH_3)_2]_4$, said first temperature is 310° C. and said second distinct temperature is 350° C.

24. The process of claim 13 wherein said multiple metal and metalloid compound layer is selected from the group consisting of mixed metal and metalloid alloys, mixed metal and metalloid oxides, mixed metal metalloid nitrides, mixed metal and metalloid carbides, mixed metal and metalloid carbonitrides, mixed metal metalloid oxycarbonitrides, mixed metal and metalloid oxycarbides, mixed metal and metalloid oxynitrides, mixed metal and metalloid borides, mixed metal metalloid sulfides, mixed metal and metalloid phosphides, mixed metal metalloid arsenides, mixed metal metalloid antimonides, mixed metal metalloid selenides, mixed metal metalloid tellurides and mixtures thereof.

25. The process of claim 13 wherein said metalloid is selected from the group consisting of boron, silicon, arsenic, tellurium, and mixtures thereof.

26. The process of claim 13 wherein said metalloid is silicon.

27. The process of claim 13 wherein said metal is a transition metal.

28. The process of claim 13 wherein said metal is selected from the group consisting of zinc, cadmium, mercury, aluminum, germanium, gallium, indium, thallium, tin, lead, antimony, bismuth, lithium, sodium, potassium, rubidium, cesium, beryllium, magnesium, calcium, strontium, barium, scandium, yttrium, lanthanum, titanium, zirconium, hafnium, vanadium, niobium, tantalum, chromium, molybdenum, tungsten, manganese, technetium rhenium, iron, ruthenium, osmium, cobalt, rhodium, iridium, nickel, palladium, platinum, copper, silver, gold, cerium and mixtures thereof.

* * * * *